United States Patent
Stoller et al.

(10) Patent No.: US 11,443,812 B2
(45) Date of Patent: Sep. 13, 2022

(54) SETTING AN INITIAL ERASE VOLTAGE USING FEEDBACK FROM PREVIOUS OPERATIONS

(71) Applicant: Micron Technology, Inc., Boise, ID (US)

(72) Inventors: Scott A. Stoller, Boise, ID (US);
Pitamber Shukla, Boise, ID (US);
Priya Venkataraman, Boise, ID (US);
Giuseppina Puzzilli, Boise, ID (US);
Niccolo' Righetti, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/127,358

(22) Filed: Dec. 18, 2020

(65) Prior Publication Data
US 2022/0199163 A1 Jun. 23, 2022

(51) Int. Cl.
*G11C 16/16* (2006.01)
*G11C 16/34* (2006.01)
*G11C 16/04* (2006.01)

(52) U.S. Cl.
CPC .......... *G11C 16/16* (2013.01); *G11C 16/0483* (2013.01); *G11C 16/349* (2013.01); *G11C 16/3445* (2013.01)

(58) Field of Classification Search
CPC . G11C 16/16; G11C 16/0483; G11C 16/3445; G11C 16/349
See application file for complete search history.

(56) References Cited

U.S. PATENT DOCUMENTS 9,312,013 B1 * 4/2016 Lin ..................... G11C 16/3495
9,786,378 B1 * 10/2017 Zhang ..................... G11C 16/26

* cited by examiner

*Primary Examiner* — Jay W. Radke
(74) *Attorney, Agent, or Firm* — Nicholson De Vos Webster & Elliott LLP

(57) ABSTRACT

A method is described that includes performing a first erase operation on a set of memory cells of a memory device using an erase voltage, which is set to a first voltage value and adjusting the erase voltage to a second voltage value based on feedback from performance of at least the first erase operation. The method further includes performing a second erase operation on the set of memory cells using the erase voltage, which is set to the second voltage value. In this configuration, the erase voltage set to the second voltage value is an initial voltage applied to the set of memory cells to perform erase operations such that each subsequent erase operation on the set of memory cells following the first erase operation uses an erase voltage that is equal to or greater than the second voltage value when erasing the first set of memory cells.

20 Claims, 6 Drawing Sheets

FIG. 4

| NUMBER OF PROGRAM AND ERASE OPERATIONS 402 | INITIAL ERASE VOLTAGE VALUES 404 |
|---|---|
| 0 | 15 VOLTS |
| 500 | 15.5 VOLTS |
| 1,000 | 16 VOLTS |
| 2,000 | 16.5 VOLTS |
| 2,500 | 17 VOLTS |
| 3,000 | 17.5 VOLTS |

400

$404_1$, $404_2$, $404_3$, $404_4$, $404_5$, $404_6$

SETTING AN INITIAL ERASE VOLTAGE USING FEEDBACK FROM PREVIOUS OPERATIONS

TECHNICAL FIELD

The present disclosure generally relates to erase voltages, and more specifically, relates to setting an initial erase voltage value based on feedback from previous operations.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 4 is a table that maps numbers of program and erase cycles to erase voltage values, in accordance with some other embodiments of the present disclosure.

DETAILED DESCRIPTION

Figure 1:
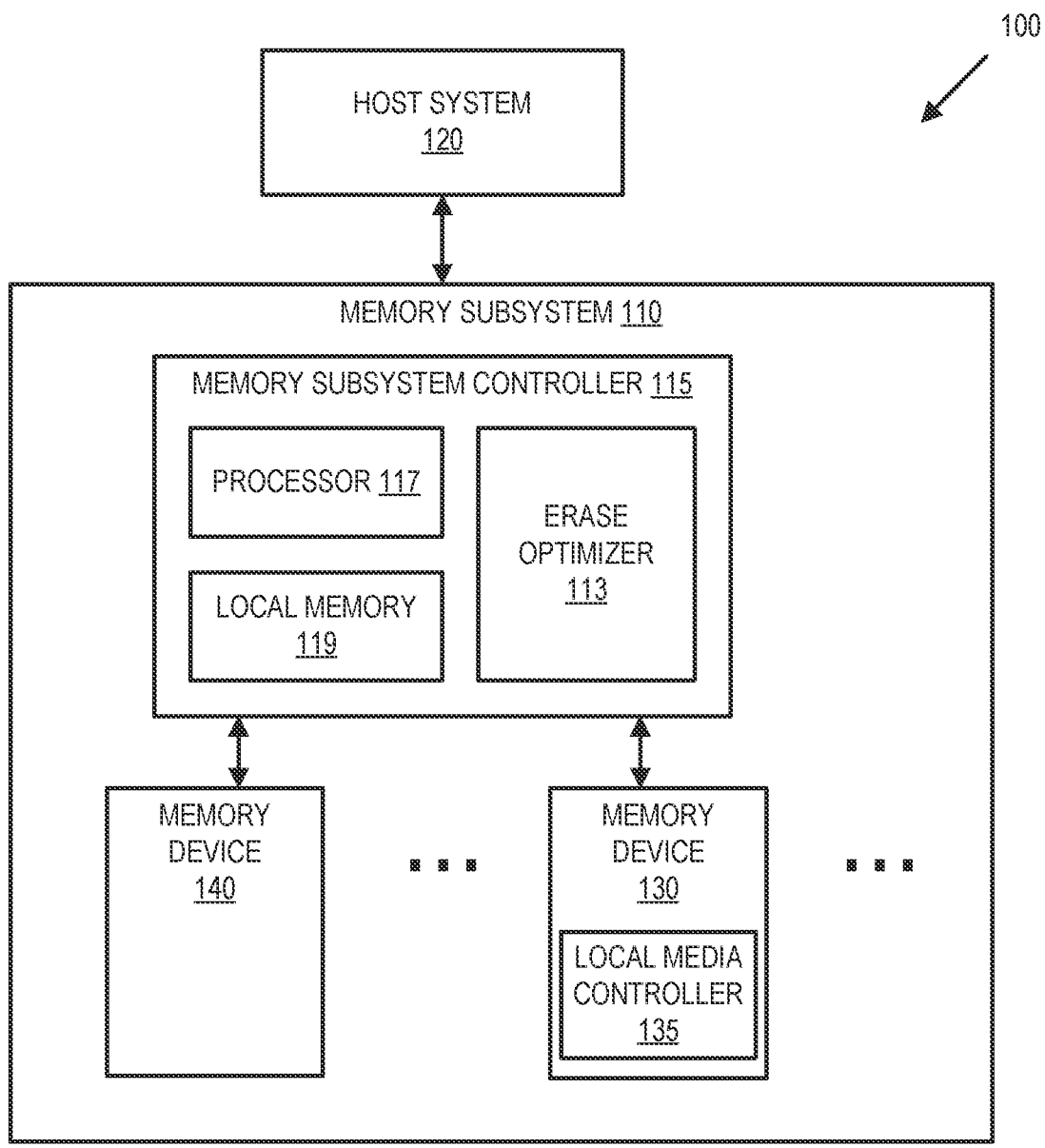
FIG. 1 illustrates an example computing system that includes a memory subsystem, in accordance with some embodiments of the present disclosure.

Aspects of the present disclosure are directed to setting an initial erase voltage based on feedback from previous operations in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dies. One example of non-volatile memory devices is a negative-and (NAND) memory device. Other examples of non-volatile memory devices are described below in conjunction with FIG. 1. The dies in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

A memory subsystem can include a memory subsystem controller and a NAND memory device. The memory subsystem controller can perform program and erase operations/cycles on memory cells of the NAND memory device. In particular, a program operation can cause a group of memory cells to enter a programmed/off state (e.g., a logical value of "0" or unset state) and an erase operation can cause a group of memory cells to enter an erase/on state (e.g., a logical value of "1" or set state). NAND memory cells are each designed to handle a prescribed number of program and erase operations. For example, a NAND memory cell can be designed to withstand between 3,000 and 10,000 combined program and erase operations before the NAND memory cell is considered end-of-life (sometimes referred to as "post-cycled") and may begin to fail, including exhibiting a higher error rate. As the memory subsystem controller progressively applies more program and erase operations to a memory cell of a NAND memory device, the NAND memory cell ages and degrades. This memory cell degradation can make it more difficult to erase the memory cell. In particular, to perform an erase operation, a prescribed erase voltage is applied to a set of memory cells. As used herein, an erase voltage is the potential opposite of the programming voltage that causes charge to be moved to or from a NAND memory cell to put the memory cell in an erased/on state. For example, a memory subsystem controller can apply an erase voltage to a block of pages of a NAND memory device to perform an erase operation. For instance, each page is 16,000 bytes (e.g., 214) along with some spare memory area (e.g., 2,000 bytes). In this configuration, each page corresponds to approximately 148,000 bits/memory cells (e.g., 214+2,000×8=148,736) and an erase operation can be performed on P*148,000 memory cells, where P is a number of pages. At the start of the lifetime of the set of memory cells (i.e., no or few program and/or erase operations have been performed to the set of memory cells), an erase voltage, which will cause the voltage of the memory cell to move to an erased/set state, can be lower (e.g., 15-16 volts) than at later times to achieve a successful erase. Following application of the erase voltage, the memory subsystem controller can perform a verification operation to determine if the erase voltage at its current setting successfully erased the set of memory cells. In particular, the verification operation determines whether an erase voltage has successfully erased the set of memory cells (e.g., set each of the memory cells to the logical value of "1"). When the verification operation determines that the set of memory cells was successfully erased, the erase operation is complete.

Use of a low initial erase voltage to perform an erase operation will likely result in a successful erase of the set of memory cells, as confirmed by the verification operation, when an age and degradation level corresponding to the set of memory cells is relatively low (e.g., few if any program and erase operations have been performed in relation to the set of memory cells). However, when the verification operation indicates that the set of memory cells were not successfully erased with the initial low erase voltage, which will be a more likely occurrence when the age/degradation level of the set of memory cells is higher (e.g., many program and erase operations have been performed in relation to the set of memory cells), a different, higher erase voltage is applied to the set of memory cells. For example, the higher erase voltage can be a 0.5-0.6 volt increase from the initial erase voltage (e.g., 15.5-16.5 volts) while in another examples, the increases/increments can be even smaller (e.g., 0.005-0.2 volt increases) or even larger (e.g., 0.2 to 1 volt increases). This process of incrementing the erase voltage continues until the verification operation indicates that an erase operation was successful in relation to the set of memory cells. Accordingly, several increasingly large erase voltages can be applied to a set of memory cells before the set of memory cells are successfully erased. Further, for each erase operation, the same initial erase voltage (e.g., 15-16 volts) is preliminarily applied along with potentially several successive incrementally increasing erase voltages until a successful erase has been performed. However, application of multiple erase voltages to the set of memory cells causes extended wear and degradation to the set of memory cells. In particular, application of an erase voltage can degrade a tunnel layer (e.g., oxide layer) of the NAND memory device by introducing traps/imperfections to the tunnel layer. Accordingly, applying successively higher erase voltages until a suitable erase voltage is found/applied can result in excessive degradation of the NAND memory device. Further, applying a single large erase voltage (e.g., the initial erase voltage is the highest possible erase voltage) can also result in excessive degradation of the NAND memory device. In particular, although this high erase voltage can be suitable at the end of life of a NAND memory device, at any time before the end of life of a NAND memory device this large erase voltage will cause excessive wear as it results in increased/excessive movement of electrons across the tunnel layer and consequent increased/excessive traps/imperfections in the tunnel layer. Additionally, application of multiple erase voltages to the set of memory cells increases the time/duration of application of erase voltages to the set of memory cells, which increases erase latency (e.g., the time it takes from issuance of an erase operation to completion of the erase operation). This increased duration of erase voltages also increases the traps/imperfections in a channel layer of the memory cells. Increased traps/imperfections in the channel layer decreases cross-temperature performance of the set of memory cells (e.g., (1) programming the set of memory cells under cold temperature conditions and reading the set of memory cells under hot temperature conditions and/or (2) programming the set of memory cells under hot temperature conditions and reading the set of memory cells under cold temperature conditions can result in a significant movement of the voltage threshold of the memory cells when traps/imperfections are present in the channel layer). Moreover, the technique described above can lead to memory cells at different erase depths (i.e., memory cells that are at significantly different voltage levels relative to a threshold voltage).

Aspects of the present disclosure address the above and other deficiencies by progressively increasing an initial erase voltage value used to erase a set of memory cells. In particular, at the beginning of the lifetime of a NAND memory device, a memory subsystem controller sets an erase voltage to a low value (e.g., 15-16 volts). This erase voltage value is an initial voltage the memory subsystem controller will use to erase memory cells in the NAND memory device. Following application of the erase voltage with this relatively low value, the memory subsystem controller can perform a verification operation to determine if the erase operation with the low voltage value was successful. In response to determining that the erase operation with the erase voltage value set to the low voltage was not successful, the memory subsystem controller raises the erase voltage value by an increment value (e.g., 0.01 volts). This incremented erase voltage is not only used to again attempt the current erase but will also be used as the initial erase voltage value for future erase operations until the erase voltage again fails to successfully erase the memory cells. When the erase voltage again fails to erase the subject memory cells, the memory subsystem controller can again increment the erase voltage value by the increment value until the memory cells are successfully erased and this newly incremented erase voltage value is used as the initial erase voltage value for future erase operations. For example, at the beginning of a lifetime of a NAND memory device, the memory subsystem controller can set the erase voltage value to 15 volts. The memory subsystem controller will use this 15-volt erase voltage value for erase operations until a verification operation, indicates that an erase operation was unsuccessful. At this point, the erase voltage value is incremented by an increment value (e.g., 0.01 volts to 1 volt). For example, the memory subsystem controller can increment the erase voltage value by 0.5 volts such that the new/incremented erase voltage value is 15.5 volts. Thereafter, the current erase operation will again be attempted using the 15.5-volt erase voltage value. Further, a subsequent erase operation will initially apply the 15.5-volt erase voltage value to attempt an erase of corresponding memory cells instead of the original 15-volt erase voltage value. Upon a subsequent failure of an erase operation, the memory subsystem controller again increments the erase voltage value by the increment value of 0.5 volts such that the new/incremented erase voltage value is 16 volts. Accordingly, upon an erase operation failure, the memory subsystem controller can adjust the erase voltage value using an increment value such that subsequent erase operations begin attempting an erase of memory cells with this new/incremented value instead of a previous/lower value.

Although described as using a feedback loop to adjust an erase voltage value, in some embodiments the memory subsystem controller can set the erase voltage value based on the number of program and erase cycles/operations previously performed on the NAND memory device. For example, the memory subsystem controller can record/track the number of program and erase cycles performed on the NAND memory device, each die of the NAND memory device, and/or on each block within a NAND memory die. In this example, the memory subsystem controller can set the erase voltage value to (1) a beginning of life value (e.g., 15 volts) when the number of program and erase operations is below a beginning of life threshold (e.g., 1,000 program and erase operations), (2) a middle of life value (e.g., 17 volts) when the number of program and erase operations is above a beginning of life threshold (e.g., 1,000 program and erase operations) but below a middle of life threshold (e.g., 2,000 program and erase operations), and (3) an end of life value (e.g., 19 volts) when the number of program and erase operations is above a middle of life threshold (e.g., 2,000 program and erase operations). In either this embodiment or the previously described embodiment, by not initially beginning with the same low erase voltage value for each erase operation, the memory subsystem controller can limit (1) the number of erase voltages applied to memory cells for a single erase and (2) the time/duration of erase voltages applied to memory cells and consequently erase operation latency while still ensuring that a minimum erase voltage value is used. This in turn will reduce wear to the memory cells, including imperfections introduced to the tunnel and channel layers of the memory cells. By reducing (1) wear/imperfections introduced to the memory cells, including the tunnel and channel layers, and (2) reducing average erase operation latency by applying less erase voltages, the memory device will achieve better performance and reliability (e.g., lower error rates) and longer life. Moreover, erase depth will be maintained consistently across program/erase cycles of the blocks in the memory device by applying the optimum erase voltage value each time a block is erased.

Further, although described in relation to NAND memory devices, the techniques and systems described herein can be utilized by any memory devices that utilize an erase voltage to erase segments of the memory devices. Further, in some embodiments, the techniques and systems described herein can be utilized by memory devices that include memory cells, which represent four bits per cell. Additional details of these techniques and systems will be described in greater detail below.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM)

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes an erase optimizer 113 that can adjust an initial voltage used for performing an erase operation based on feedback from previous operations. In some embodiments, the controller 115 includes at least a portion of the erase optimizer 113. For example, the controller 115 can include a processor 117 (processing device) configured to execute instructions stored in local memory 119 for performing the operations described herein. In some embodiments, an erase optimizer 113 is part of the host system 110, an application, or an operating system.

The erase optimizer 113 can adjust an initial voltage used for performing an erase operation. Further details with regards to the operations of the erase optimizer 113 are described below.

Figure 2:
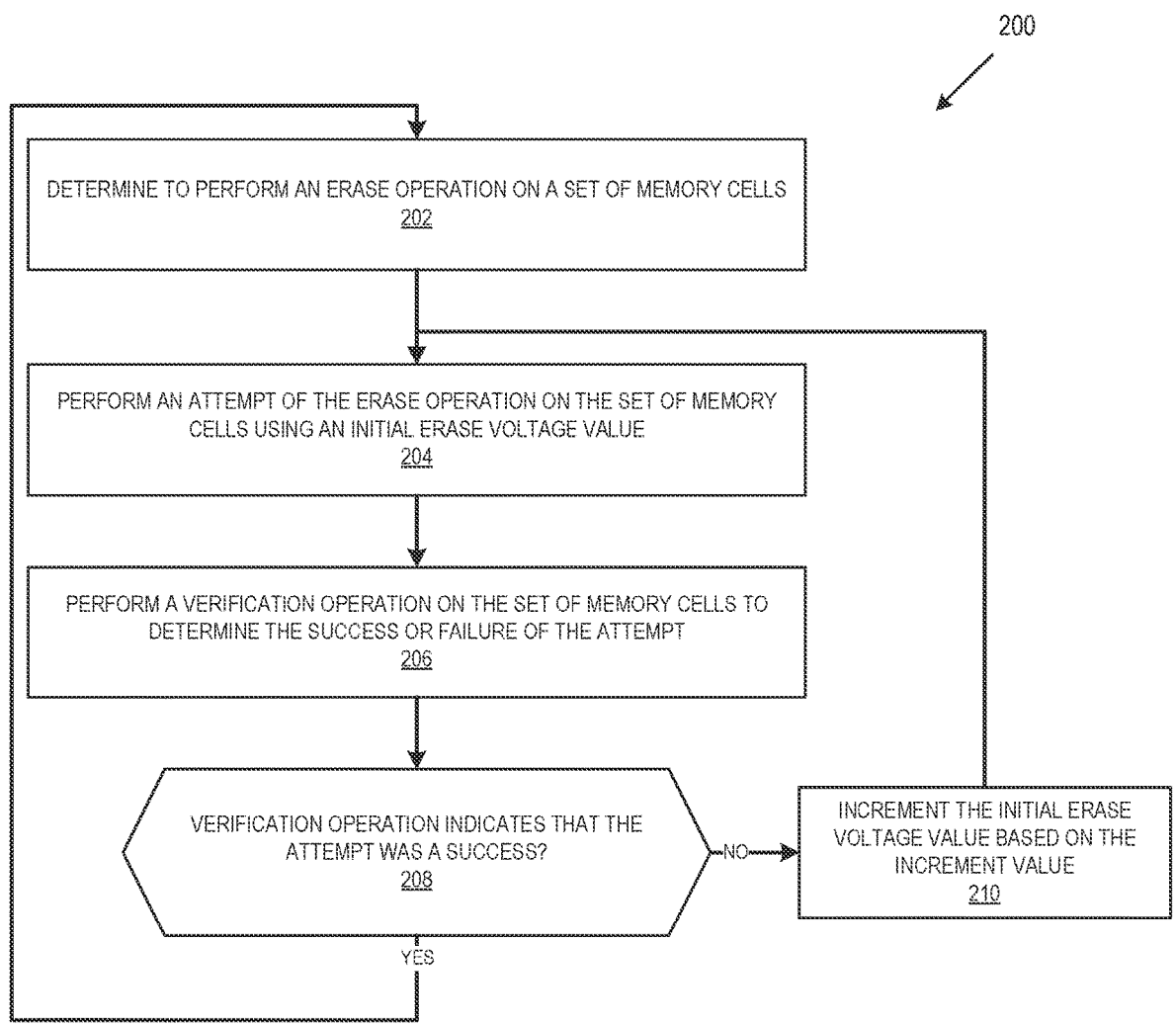
FIG. 2 is a flow diagram of an example method to adjust an initial erase voltage value used for performing an attempt of an erase operation based on feedback from previous attempts, in accordance with some embodiments of the present disclosure.

FIG. 2 is a flow diagram of an example method 200 to adjust an initial voltage used for performing an erase operation based on feedback from previous operations, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the erase optimizer 113 of FIG. 1. Although shown in a particular sequence or order, unless otherwise specified, the order of the processes/operations can be modified. Thus, the illustrated embodiments should be understood only as examples, and the illustrated processes/operations can be performed in a different order, and some processes/operations can be performed in parallel. Additionally, one or more processes/operations can be omitted in various embodiments. Thus, not all processes/operations are required in every embodiment. Other process flows are possible.

As shown in FIG. 2, the method 200 can commence at operation 202. At operation 202, the processing device determines that an erase operation is to be performed on a set of memory cells. For example, the processing device can determine that an erase operation is to be performed in response to a host or internal request to (1) delete data stored in the set of memory cells or (2) write data to the set of memory cells (e.g., the processing device is to delete the data currently stored in the set of memory cells prior to new data being written to the set of memory cells). As used herein, an erase operation attempts to change or ensure that the set of memory cells are in an erase state (e.g., an on/set state corresponding to a logical value of "1"). In one embodiment, as will be described in greater detail below, the processing device performs a single erase operation on one or more blocks of pages of a memory device. Accordingly, in this embodiment, the set of memory cells includes each of the memory cells in the one or more blocks of pages. In one embodiment, the set of memory cells can be part of the memory device 130.

At operation 204, the processing device performs an attempt of an erase operation voltage on the set of memory cells using an initial erase voltage value. The processing device performs the attempt of an erase operation by applying an erase voltage to the set of memory cells. As noted above, the processing device can perform a single erase operation on a block of pages of a memory device. For instance, each page can be 16,000 bytes, which corresponds to 148,000 bits/memory cells, such that an erase operation can be performed on P*148,000 memory cells, where P is a number of pages. Accordingly, at operation 204, the processing device performs the erase operation by applying the erase voltage to P*148,000 memory cells (where P*148,000 memory cells covers a block of pages). As noted above, in some embodiments, each page is 16,000 bytes (e.g., $2^{14}$) along with some spare memory area (e.g., 2,000 bytes). In this configuration, each page corresponds to approximately 148,000 bits/memory cells (e.g., $2^{14}+2,000\times8=148,736$) and an erase operation can be performed on P*148,000 memory cells, where P is a number of pages. As will be described in greater detail below, the processing device can set the erase voltage value based on feedback from previous erase operations and this same erase voltage value will be applied, at least initially, to memory cells for each subsequent erase operation in the memory device. For example, the processing device can apply an initial erase voltage value of 15 volts to the set of memory cells to perform an erase operation. This 15-volt initial erase voltage value is applied to the set of memory cells before any other erase voltage value, relative to this erase of the set of memory cells. If the 15-volt initial erase voltage value is successful in erasing the set of memory cells, no further erase voltage values are applied to the set of memory cells (i.e., only one erase voltage value is applied to the set of memory cells for performing the current erase). However, if the erase operation of the set of memory cells was not successful, (1) a higher erase voltage value will be applied to the set of memory cells to accomplish the current erase operation of the set of memory cells and (2) the initial erase voltage value, which will be used for each subsequent erase of the set of memory cells, will be adjusted to this higher voltage.

At operation 206, the processing device performs a verification operation on the set of memory cells to determine the success or failure of the attempt of the erase operation. In particular, the processing device determines if the set of memory cells are in the erase state (e.g., a number of memory cells in a block, within a threshold, are in a set state with a logical value of "1"). In one embodiment, the processing device can determine the success or failure of the previous attempt of the erase operation by applying a verify voltage to the set of memory cells to determine the state of each of the memory cells.

At operation 208, the processing device determines if the verification operation indicates that the attempt of the erase operation was successful. For example, when the processing device determines that each of the memory cells in the set of memory cells are each in the erase state, the processing device determines that the attempt of the erase operation was successful and the method 200 returns to operation 202 for the next erase operation. Conversely, when the processing device determines that one or more of the memory cells in the set of memory cells are not in the erase state, the processing device determines that the attempt of the erase operation was unsuccessful. In response to the processing device determining that the erase operation was unsuccessful, the method 200 moves to operation 210.

At operation 210, the processing device increments the erase voltage value based on an increment value. For example, the increment value can be a voltage amount (e.g., 0.522 volts, 0.0275 volts, 0.01 volts, 0.005-1 volts, etc.) and the processing device can increment the erase voltage value by the increment value. For instance, if the previous erase voltage value is 15 volts and the increment value is 0.522 volts, the processing device can set/increment the erase voltage value to 15.522 volts during an initial iteration of operation 210. The processing device will utilize this new erase voltage value (1) as the erase voltage value to retry the current erase operation, which was unsuccessful, and (2) as the initial erase voltage value for each subsequent erase operation until this new erase voltage value fails to produce a successful erase operation (at which point the processing device will again adjust the erase voltage value). In the case of retrying the current erase operation, an immediately subsequent attempt of an erase operation on the set of memory cells is dependent on success of the current attempt of an erase operation as the immediately subsequent attempt of an erase operation is only performed when the current attempt of an erase operation was unsuccessful. In contrast, in the case of subsequent erase operations to the current erase operation, these erase operations are independent of success or failure of the current erase operation. In particular, these subsequent erase operations are triggered by events other than the failure of the current erase operation (e.g., a host or internal request to (1) delete data stored in the set of memory cells or (2) write data to the set of memory cells). Accordingly, even though these subsequent erase operations are independent from the current erase operation, the processing device will use the erase voltage value set in response to the current erase voltage value as the initial erase voltage value (i.e., the initial/opening voltage that is used to attempt to perform an erase of the set of memory cells).

In one embodiment, a single erase voltage value is maintained for all memory cells in a memory device (e.g., the memory device 130). In another embodiment, different erase voltage values can be maintained for different groups of memory cells. For example, the processing device can maintain a different or same erase voltage value per die, per word line, per page, per block, per sub-block of memory cells in a memory device that can each be individually incremented based on feedback from previous erase and verification operations. In one embodiment, the processing device maintains one or more initial erase voltage values in a data structure in local memory 119.

Although described as incrementing the erase voltage value based on an increment value, in some embodiments the processing device can maintain an offset value that is added to a default erase voltage value. In this embodiment, the processing device increments the offset value by the increment value at operation 210 and the processing device can add this incremented offset value to the default erase voltage value to arrive at the erase voltage value (e.g., an initial erase voltage).

Following operation 210, the method 200 returns to operation 204 such that the processing device can retry the erase operation with the new/incremented erase voltage. In particular, in the example given above, the erase voltage of 15.522 volts will be used instead of the previous erase voltage of 15 volts. Upon the processing device determining at operation 208, based on a verification operation, that an erase operation was successful, the method 200 can return to operation 202.

As described above, via the method 200 the processing device can adjust the erase voltage that is initially used for subsequent erase operations based on feedback from previous erase operations. This ensures that erase operations do not always begin with the same low erase voltage. By adjusting the initial erase operation voltage based upon feedback, the processing device can limit (1) the number of erase voltages applied to memory cells for a single erase and (2) the time/duration of erase voltages applied to memory cells while still ensuring that a minimum erase voltage is used. This in turn will reduce wear to the memory cells, including imperfections introduced to the tunnel and/or channel layers of the memory cells. By reducing wear/imperfections introduced to the memory cells, including the tunnel and channel layers, the memory device will achieve better reliability (e.g., lower error rates) and improved lifetime (e.g., more program/erase cycles are allowed before failure) because the amount of degradation caused by each program/erase cycle is reduced. Reducing average erase operation latency by applying less erase voltages leads to better performance (e.g., improved block erase operation latency).

Figure 3:
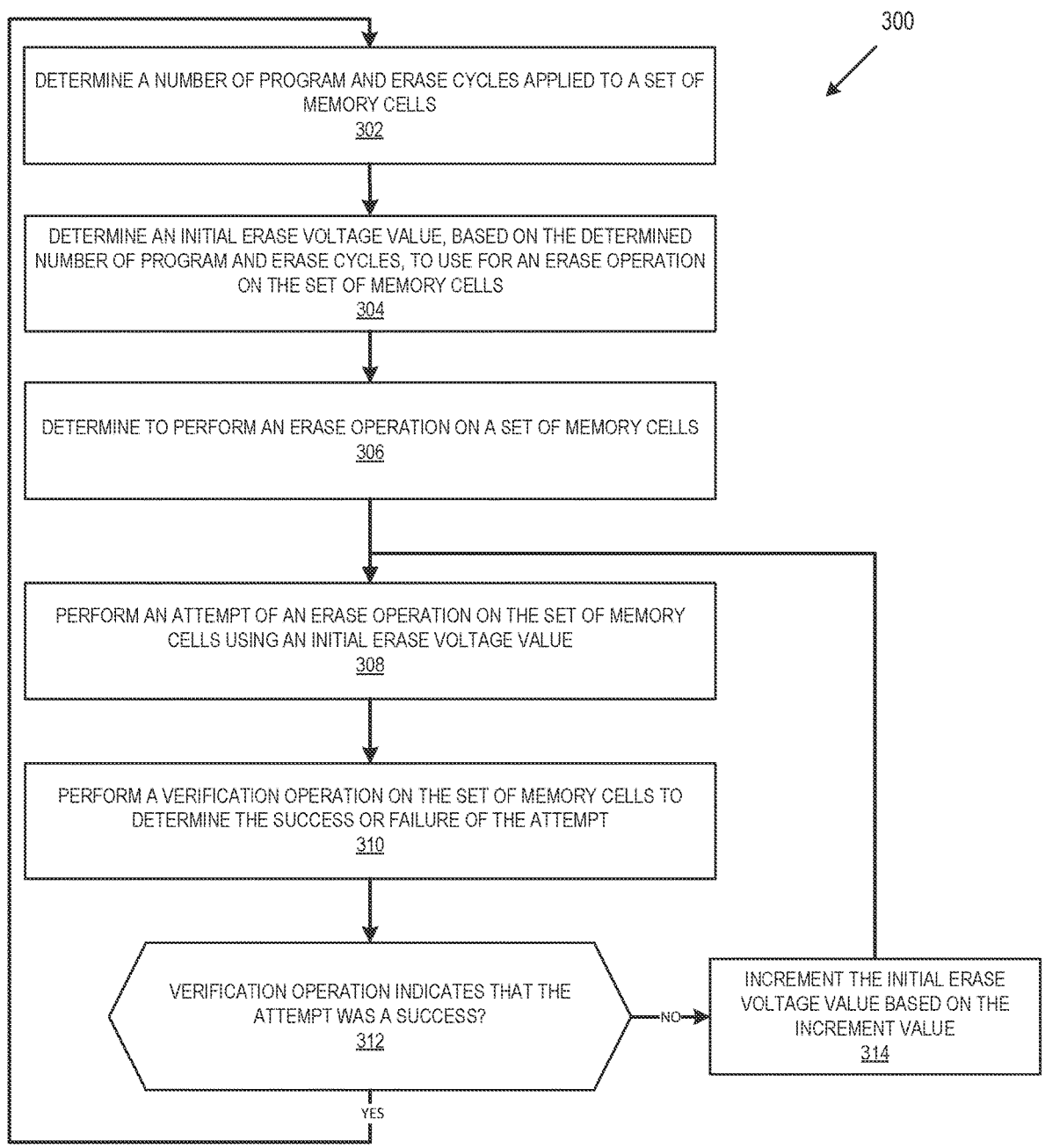
FIG. 3 is a flow diagram of an example method to adjust an initial erase voltage value used for performing an attempt of an erase operation based on feedback from previous attempts, in accordance with some other embodiments of the present disclosure.

Turning now to FIG. 3, an example method 300 will be described for adjusting an initial erase voltage value used for performing an erase operation based on feedback from previous operations, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the erase optimizer 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 3, the method 300 can commence at operation 302 with the processing device determining a number of program and erase cycles associated with a set of memory cells. In some embodiments, an erase operation can precede each program operation with the exception being a partial program block in which the processing device does not program all word lines in a block but an erase operation is performed on the block such that a pre-program is performed prior to an erase operation. For example, the memory subsystem controller 115 could have previously performed 600 program operations and 600 erase operations on a particular set of memory cells in the memory device 130. In this example, the processing device determines that 1,200 program and erase cycles have been performed in relation to the set of memory cells at operation 302. In some embodiments, the processing device can perform an erase operation on a set of memory cells (e.g., a block of pages) and periodically re-erase the set of memory cells without an intervening programming operation. In these embodiments, each erase operation on the set of memory cells is counted as a separate erase operation. In some embodiments, program and erase operations/cycles can be performed as a pair of connected operations (e.g., an erase is performed prior to a program). In some of these embodiments, the number of program and erase cycles is a single value that captures the pair of program and erase operations/cycles. The set of memory cells can be all the memory cells in the memory device 130 or a subset of the memory cells in the memory device 130 (e.g., a block or a page in the memory device 130). In one embodiment, the memory subsystem 110 can maintain a set of data structures that indicate the number of program and erase operations that have been performed on each memory cell, each page of memory cells, and/or each block of pages. In some embodiments, the number of program and erase operations performed in relation to any set of memory cells can be (1) an actual number of program and erase operation performed in relation to these memory cells or (2) the average number of program and erase operations that have been performed in relation to a group of memory cells (e.g., a page, a block, or all the memory cells in the memory device 130).

At operation 304, the processing device can determine an erase voltage value to be used during an erase operation on the set of memory cells based on the determined number of program and erase cycles associated with a set of memory cells. For example, the memory subsystem 110 can maintain a table or other data structure that maps numbers (or ranges) of program and erase operations to particular erase voltage values. For example, FIG. 4 shows a table 400 in which numbers of program and erase operations 402 are mapped to erase voltage values 404. In the table 400 of FIG. 4, each number of program and erase operations 402 represents a threshold value. Upon the processing device determining that a number of program and erase operations associated with the set of memory cells has satisfied a next highest number of program and erase operations 402 (e.g., met or exceeded) in the table 400, the processing device selects the corresponding erase voltage value 404 as the erase voltage for the set of memory cells. For example, at the beginning of the lifetime of the memory device 130 (i.e., zero program and erase operations have been performed on the memory device 130), the processing device selects the erase voltage value 4041 as the erase voltage for the set of memory cells (i.e., the erase voltage value is 15 volts). Upon or after the number of program and erase operations on the set of memory cells is 500, the processing device selects the erase voltage value 4042 as the erase voltage for the set of memory cells (i.e., the erase voltage value is 15.5 volts). Upon or after the number of program and erase operations on the set of memory cells is 1,000, the processing device selects the erase voltage value 4043 as the erase voltage for the set of memory cells (i.e., the erase voltage value is 16 volts). Upon or after the number of program and erase operations on the set of memory cells is 2,000, the processing device selects the erase voltage value 4044 as the erase voltage for the set of memory cells (i.e., the erase voltage value is 16.5 volts). Upon or after the number of program and erase operations on the set of memory cells is 2,500, the processing device selects the erase voltage value 4045 as the erase voltage for the set of memory cells (i.e., the erase voltage value is 17 volts). Upon or after the number of program and erase operations on the set of memory cells is 3,000, the processing device selects the erase voltage value 4046 as the erase voltage for the set of memory cells (i.e., the erase voltage value is 17.5 volts).

Following operation 304, the method 300 can move to operations 306-314. Operations 306-314 can operate in the same or similar fashion as operations 202-210 of the method 200. Accordingly, in some embodiments, the processing device can increment the erase voltage value by an increment value when the erase voltage value that was set using the table 400 did not result in a successful attempt of an erase operation. In some embodiments, operations 310, 312, and 314 are optional and the method 300 moves from operation 308 to operation 302.

As described above, via the method 300 the processing device can adjust the erase voltage that is initially used for subsequent erase operations based on feedback from previous operations (e.g., the numbers of program and erase operations previously performed on the set of memory cells). This ensures that erase operations do not always have to begin with the same low erase voltage. By not initially beginning with the same low erase voltage for each and every erase operation, the processing device can limit (1) the number of erase voltages applied to memory cells for a single erase and (2) the time/duration of erase voltages applied to memory cells while still ensuring that a minimum erase voltage is used. This in turn will reduce wear to the memory cells, including imperfections introduced to the tunnel and channel layers of the memory cells. By reducing wear/imperfections introduced to the memory cells, including the tunnel and channel layers, the memory device will achieve better reliability (e.g., lower error rates) and improved lifetime (e.g., more program/erase cycles are allowed before failure) because the amount of degradation caused by each program/erase cycle is reduced. Reducing average erase operation latency by applying less erase voltages leads to better performance (e.g., improved block erase operation latency).

In some embodiments, the method 200 of FIG. 2 can be performed independently of the method 300 of FIG. 3. In particular, the method 300 can incorporate one or more of the operations of the method 200 (e.g., the operations 306-314 can represent the method 200). In other embodiments, the methods 200 and 300 can be run concurrently with each other to adjust an initial erase voltage.

Figure 5:
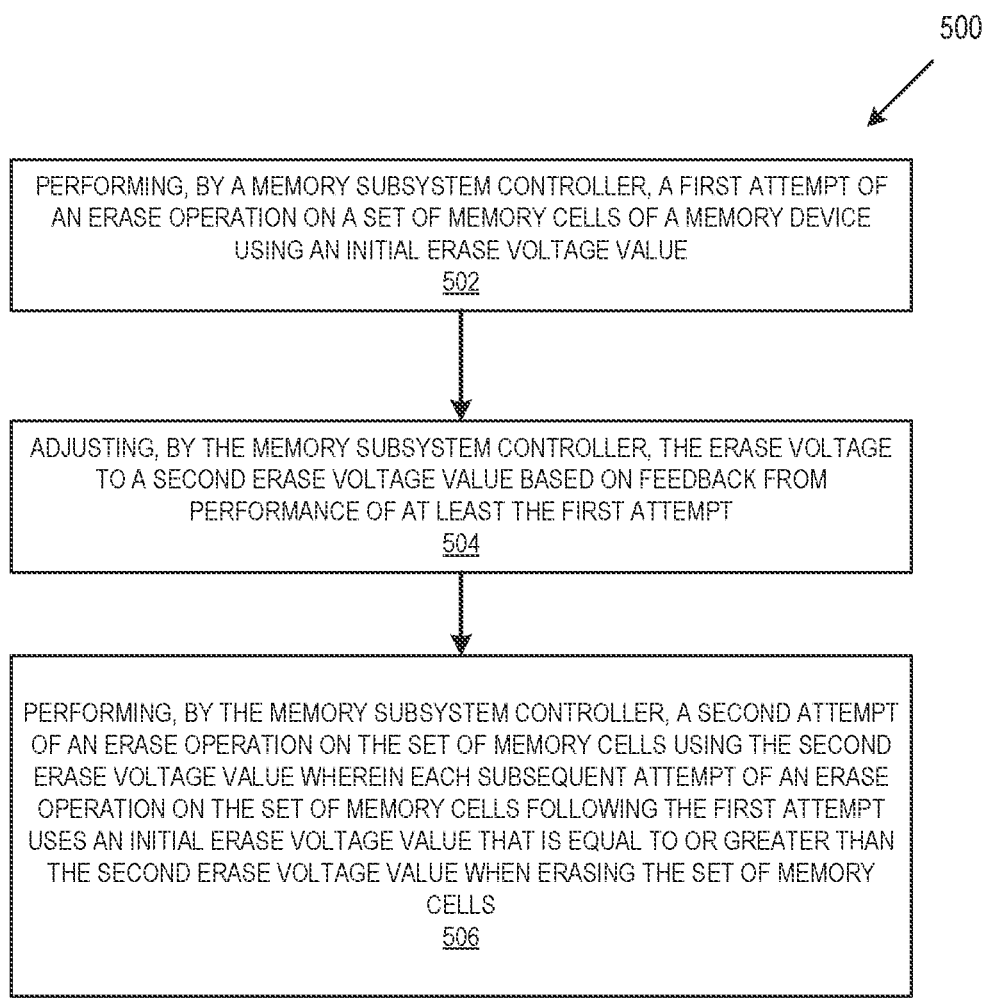
FIG. 5 is a flow diagram of an example method to adjust an initial erase voltage value used for performing an attempt of an erase operation based on feedback from previous attempts, in accordance with still other embodiments of the present disclosure.

Turning now to FIG. 5, an example method 500 will be described for adjusting an initial erase voltage value used for performing an erase operation based on feedback from previous operations, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the erase optimizer 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 5, the method 500 commences at operation 502 with a processing device performing a first attempt of an erase operation on a set of memory cells of a memory device (e.g., the memory device 130) using an erase voltage value that is set to a particular voltage value. For example, the erase voltage value can be set to 15 volts and the processing device can be performing an attempt of an erase operation on a block of pages in the memory device 130 at operation 502.

At operation 504, the processing device adjusts the erase voltage value to another voltage value based on feedback from performance of at least the previously performed erase operation from operation 502. For example, the processing device can (1) increment the erase voltage value by an increment value (e.g., between 0.275 volts and 0.522 volts) or (2) set the erase voltage value to a voltage value from a data structure corresponding to the number of program and erase operations previously performed on the set of memory cells.

At operation 506, the processing device performs another erase operation on the set of memory cells using the erase voltage value, which was adjusted/set to a new voltage value at operation 504. In this configuration, the erase voltage value set to the second voltage value is an initial erase voltage value that is applied to the set of memory cells to perform erase operations such that each subsequent erase operation on the set of memory cells following the first erase operation uses an erase voltage value that is equal to or greater than the second erase voltage value when erasing the first set of memory cells. In particular, the erase voltage value that was set at operation 504 (1) can be used for performing subsequent erase operations regardless of the success of past erase operations and (2) is the initial erase voltage value that is applied to the set of memory cells for performing an erase (i.e., no other erase voltage value is attempted for a subsequent erase option prior to this voltage).

Figure 6:
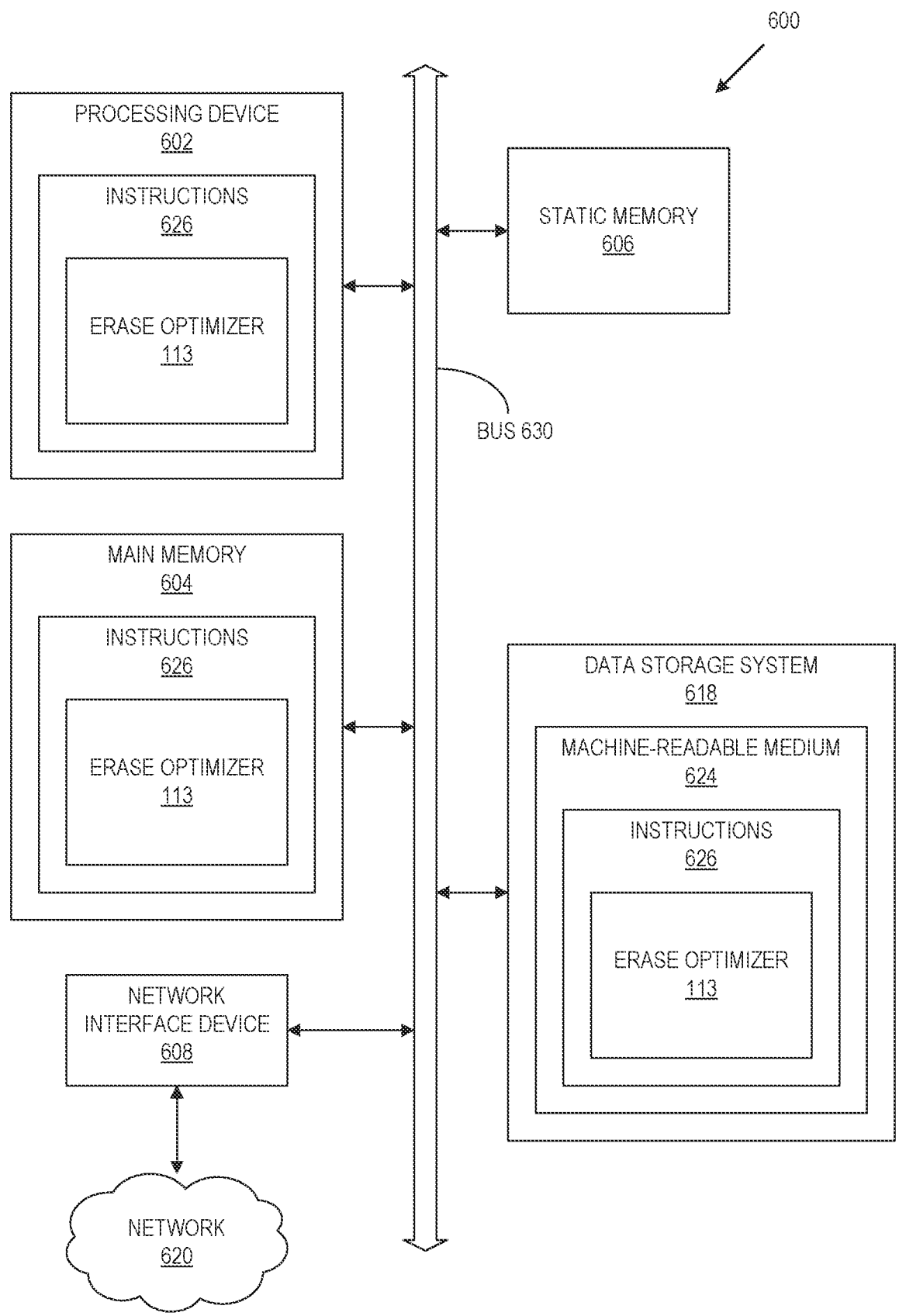
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the erase optimizer 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory subsystem 110 of FIG. 1.

In one embodiment, the instructions 626 include instructions to implement functionality corresponding to an erase optimizer (e.g., the erase optimizer 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200, 300, and 500 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
performing, by a memory subsystem controller, a first attempt of an erase operation on a set of memory cells of a memory device using an erase voltage, which is set to a first voltage value;
adjusting, by the memory subsystem controller, the erase voltage to a second voltage value based on feedback from performance of at least the first attempt of the erase operation; and performing, by the memory subsystem controller, a second attempt of the erase operation on the set of memory cells using the erase voltage, which is set to the second voltage value,
wherein the erase voltage set to the second voltage value is an initial voltage applied to the set of memory cells to perform at least one subsequent erase operation such that each of the at least one subsequent erase operation on the set of memory cells uses an erase voltage value that is equal to or greater than the second voltage value when erasing the set of memory cells.

2. The method of claim 1, wherein adjusting the erase voltage includes:
performing a verification operation on the set memory cells following the first attempt of the erase operation to determine whether the first attempt of the erase operation was successful; and
incrementing, in response to determining that the first attempt of the erase operation was unsuccessful, the erase voltage by an increment value to set the erase voltage to the second voltage value.

3. The method of claim 2, wherein the increment value is one of 0.01 volts, 0.522 volts, and 0.275 volts.

4. The method of claim 2, wherein the second attempt of the erase operation is performed when the first attempt of the erase operation was unsuccessful.

5. The method of claim 4, further comprising:
performing, by the memory subsystem controller, a third attempt of the erase operation on the set of memory cells using the erase voltage, which is set to the second voltage value,
wherein the third attempt of the erase operation is performed following the second attempt of the erase operation and is performed in a separate erase operation independent of success of the first attempt of the erase operation and the second attempt of the erase operation, and
wherein the second erase voltage value is an initial voltage applied to the set of memory cells to perform the third attempt of the erase operation to attempt to erase the first set of memory cells.

6. The method of claim 1, wherein adjusting the erase voltage includes:
determining a number of program and erase operations performed on the memory device;
determining that the number of program and erase operations has satisfied a first threshold value; and
setting, in response to determining that the number of program and erase operations has satisfied the first threshold value, the erase voltage to the second voltage value, wherein the erase voltage set with the second voltage value is used as an initial voltage to perform erase operations until a second threshold value is satisfied.

7. The method of claim 1, wherein the erase voltage is associated with the set of memory cells based on use of the set of memory cells and another erase voltage is associated with another set of memory cells in the memory device based on use of the another set of memory cells.

8. A non-transitory computer-readable storage medium comprising instructions that, when executed by a processing device, cause the processing device to:
perform a first attempt of an erase operation on a set of memory cells of a memory device using an erase voltage, which is set to a first voltage value;
adjust the erase voltage to a second voltage value based on feedback from performance of at least the first attempt of the erase operation; and
perform a second attempt of the erase operation on the set of memory cells using the erase voltage, which is set to the second voltage value,
wherein the erase voltage set to the second voltage value is an initial voltage applied to the set of memory cells to perform at least one subsequent erase operation such that each of the at least one subsequent erase operation on the set of memory cells uses an erase voltage value that is equal to or greater than the second voltage value when erasing the set of memory cells.

9. The non-transitory computer-readable storage medium of claim 8, wherein adjusting the erase voltage includes:
performing a verification operation on the set memory cells following the first attempt of the erase operation to determine whether the first attempt of the erase operation was successful; and
incrementing, in response to determining that the first attempt of the erase operation was unsuccessful, the erase voltage value by an increment value to set the erase voltage to the second voltage value.

10. The non-transitory computer-readable storage medium of claim 9, wherein the increment value is one of 0.01 volts, 0.522 volts, and 0.275 volts.

11. The non-transitory computer-readable storage medium of claim 9, wherein the second attempt of the erase operation is performed when the first attempt of the erase operation was unsuccessful.

12. The non-transitory computer-readable storage medium of claim 8, wherein the processing device is further caused to:
perform a third attempt of the erase operation on the set of memory cells using wherein the erase voltage, which is set to the second voltage value,
wherein the third attempt of the erase operation is performed following the second attempt of the erase operation and is performed in a separate erase operation independent of success of the first attempt of the erase operation and the second attempt of the erase operation, and
wherein the second erase voltage value is an initial voltage applied to the set of memory cells to perform the third attempt of the erase operation to attempt to erase the first set of memory cells.

13. The non-transitory computer-readable storage medium of claim 8, wherein adjusting the erase voltage includes:
determining a number of program and erase operations performed on the memory device;
determining that the number of program and erase operations has satisfied a first threshold value; and
setting, in response to determining that the number of program and erase operations has satisfied the first threshold value, the erase voltage to the second voltage value, wherein the erase voltage set with the second voltage value is used as an initial voltage to perform erase operations until a second threshold value is satisfied.

14. The non-transitory computer-readable storage medium of claim 8, wherein the erase voltage is associated with the set of memory cells based on use of the set of memory cells and another erase voltage is associated with another set of memory cells in the memory device based on use of the another set of memory cells.

15. A system comprising:
a memory device; and
a processing device, operatively coupled with the memory device, to:
- perform a first attempt of an erase operation on a set of memory cells of a memory device using an erase voltage, which is set to a first voltage value;
- adjust the erase voltage to a second voltage value based on feedback from unsuccessful performance of the first attempt of the erase operation;
- perform a second attempt of the erase operation on the set of memory cells using the erase voltage, which is set to the second voltage value, wherein the second attempt of the erase operation successfully erases the set of memory cells; and
- perform a third attempt of the erase operation on the set of memory cells using the erase voltage, which is set to the second voltage value, wherein the erase voltage set to the second voltage value is an initial voltage applied to the set of memory cells to perform the third attempt of the erase operation.

16. The system of claim 15, wherein adjusting the erase voltage includes:
- performing a verification operation on the set memory cells following the first attempt of the erase operation to determine whether the first attempt of the erase operation was successful; and
- incrementing, in response to determining that the first attempt of the erase operation was unsuccessful, the erase voltage by an increment value to set the erase voltage to the second voltage value.

17. The system of claim 16, wherein the increment value is one of 0.01 volts, 0.522 volts, and 0.275 volts.

18. The system of claim 15, wherein the second attempt of the erase operation is performed when the first attempt of the erase operation was unsuccessful.

19. The system of claim 18, wherein the first attempt of the erase operation and the second attempt of the erase operation are triggered by a first event and the third attempt of the erase operation is triggered by a second event that is independent from the first event.

20. The system of claim 15, wherein the erase voltage is associated with the set of memory cells based on use of the set of memory cells and another erase voltage is associated with another set of memory cells in the memory device based on use of the another set of memory cells.

* * * * *